(12) United States Patent
Ishihara et al.

(10) Patent No.: US 8,952,261 B2
(45) Date of Patent: Feb. 10, 2015

(54) INTERCONNECT-USE ELECTRONIC COMPONENT AND METHOD FOR PRODUCING SAME

(75) Inventors: Masamichi Ishihara, Kitakyushu (JP); Minoru Enomoto, Kitakyushu (JP); Shigeru Nomura, Mishima-gun (JP)

(73) Assignee: Kyushu Institute of Technology, Fukuoka (JP)

(*) Notice: Subject to any disclaimer, the term of this patent is extended or adjusted under 35 U.S.C. 154(b) by 257 days.

(21) Appl. No.: 13/518,145

(22) PCT Filed: Nov. 24, 2010

(86) PCT No.: PCT/JP2010/070920
§ 371 (c)(1),
(2), (4) Date: Jun. 21, 2012

(87) PCT Pub. No.: WO2011/077886
PCT Pub. Date: Jun. 30, 2011

(65) Prior Publication Data
US 2012/0261169 A1 Oct. 18, 2012

(30) Foreign Application Priority Data
Dec. 22, 2009 (JP) ................................. 2009-290235

(51) Int. Cl.
*H05K 1/02* (2006.01)
*H05K 1/03* (2006.01)
(Continued)

(52) U.S. Cl.
CPC ...... *H01L 23/49827* (2013.01); *H01L 23/3114* (2013.01); *H01L 23/5389* (2013.01); *H01L 2224/48227* (2013.01);
(Continued)

(58) Field of Classification Search
USPC .......... 257/693, 701, 737, E21.237; 438/108, 438/127, 118, 124; 174/255–259
See application file for complete search history.

(56) References Cited

U.S. PATENT DOCUMENTS 6,881,975 B2 4/2005 Anzai et al.
6,919,226 B2 * 7/2005 Ogawa et al. ................. 438/108
(Continued)

FOREIGN PATENT DOCUMENTS

EP 0 252 739 B1 10/1993
JP 63-153814 A 6/1988
(Continued)

*Primary Examiner* — Hoa C Nguyen
(74) *Attorney, Agent, or Firm* — McGlew and Tuttle, P.C.

(57) ABSTRACT

The present invention enables additional processes required for forming vertical wiring and rewiring in a double face package (DFP) or a wafer level chip size package (WLCSP) to be implemented through use of a component for vertical wiring and rewiring, to thereby simplify the manufacturing process and reduce cost. An electronic component for interconnection is incorporated into an electronic device package in which a circuit element including a semiconductor chip is disposed and which has external electrodes connected to the circuit element via vertical interconnects and horizontal interconnects. This electronic component for interconnection is composed of a wiring substrate which includes horizontal interconnects and vertical interconnects connected to the horizontal interconnects and extending therefrom in a vertical direction; and a support plate to which the wiring substrate having the horizontal interconnects and the vertical interconnects is bonded through use of an adhesive which can be separated with water.

19 Claims, 15 Drawing Sheets

(51) Int. Cl.
*H01L 23/48* (2006.01)
*H01L 21/00* (2006.01)
*H01L 23/498* (2006.01)
*H01L 23/31* (2006.01)
*H01L 23/538* (2006.01)
*H01L 23/00* (2006.01)

(52) U.S. Cl.
CPC ............... *H01L 2924/01004* (2013.01); *H01L 2924/01046* (2013.01); *H01L 2924/01078* (2013.01); *H01L 2924/01079* (2013.01); *H01L 24/48* (2013.01); *H01L 2224/16225* (2013.01); *H01L 2224/32225* (2013.01); *H01L 2224/73204* (2013.01); *H01L 2224/73265* (2013.01)
USPC ............ 174/259; 174/255; 257/693; 438/118

(56) References Cited

U.S. PATENT DOCUMENTS

| | | | |
|---|---|---|---|
| 7,554,169 B2 | 6/2009 | Anzai et al. | |
| 7,939,831 B2 | 5/2011 | Anzai et al. | |
| 8,153,506 B2 | 4/2012 | Anzai et al. | |
| 8,399,980 B2 | 3/2013 | Ishihara et al. | |
| 8,597,983 B2* | 12/2013 | Gong et al. | 438/107 |
| 2001/0038151 A1* | 11/2001 | Takahashi et al. | 257/778 |
| 2003/0090883 A1* | 5/2003 | Asahi et al. | 361/761 |
| 2004/0251461 A1 | 12/2004 | Anzai et al. | |
| 2005/0001331 A1* | 1/2005 | Kojima et al. | 257/778 |
| 2005/0186429 A1 | 8/2005 | Anzai et al. | |
| 2006/0121718 A1* | 6/2006 | Machida et al. | 438/612 |
| 2009/0008765 A1 | 1/2009 | Yamano et al. | |
| 2010/0295178 A1* | 11/2010 | Ishihara et al. | 257/737 |
| 2011/0012269 A1 | 1/2011 | Ishihara et al. | |
| 2012/0127667 A1* | 5/2012 | Ohsawa et al. | 361/709 |

FOREIGN PATENT DOCUMENTS

| | | |
|---|---|---|
| JP | 2004-214645 A | 7/2004 |
| JP | 2006-237521 A | 9/2006 |
| JP | 2006-237634 A | 9/2006 |
| JP | 4182140 | 11/2008 |
| JP | 2009-246104 | 10/2009 |
| WO | 2009/123048 A1 | 10/2009 |

* cited by examiner

METAL LAYER FOR VERTICAL

UPPER METAL LAYER FOR HORIZONTAL

LOWER METAL LAYER FOR HORIZONTAL

UPPER METAL LAYER

LOWER METAL LAYER

ADHESIVE    THIN TAPE

INTERCONNECT-USE ELECTRONIC COMPONENT AND METHOD FOR PRODUCING SAME

TECHNICAL FIELD

The present invention relates to an electronic component for interconnection to be incorporated, for use, into an electronic device package in which a circuit element including a semiconductor chip is disposed and which has external electrodes connected to the circuit element via vertical interconnects (may be referred to as "vertical wiring") and horizontal interconnects (may be referred to as "horizontal wiring"), and to a method of manufacturing the same.

BACKGROUND ART

In association with miniaturization and enhanced performance of electronic products including LSI chips, there has been strong demand for a reduction in package size and high density packaging. Under these circumstances, various package structures have been proposed. Particularly, in recent years, there have been proposed a double face package (hereafter abbreviated to DFP) for stacking LSIs in order to increase packaging density, and an IC built-in substrate including an IC or LSI disposed within the substrate. The DFP and the IC built-in substrate require a structure which includes vertical interconnects for establishing electrical connection between an LSI-chip mounted substrate and electrodes on the side opposite the substrate or establishing electrical connection between the LSI-chip mounted substrate and an upper substrate, and/or horizontal interconnects for wiring. In general, vertical interconnects of a DFP are formed through employment of a structure in which vertical interconnects are previously formed in a substrate, a method of forming openings in resin after performance of resin sealing and filling the openings with plating, or a structure in which electrodes extend through a silicon substrate such that the electrodes are exposed on opposite faces thereof. As described above, the structure according to the conventional technique is likely to increase cost, because a complicated process is required for formation of vertical wiring and rewiring.

Patent Document 1 discloses the structure of an IC built-in substrate using an organic substrate. In this IC built-in substrate, solder balls or metal post structures are used as vertical interconnects. Since a thick metal player which corresponds to a support layer is provided on upper and lower substrates in the manufacturing process, the manufacturing process requires a step of removing the thick metal layer after the upper and lower substrates are joined together. Therefore, the manufacturing process is complex, which greatly increases the production cost.

Patent Document 2 discloses an electronic component for interconnection which solves the above-mentioned problem. In the electronic component for interconnection, additional processes for forming vertical wiring and rewiring, which are required for formation of the structure of a double face package (DFP) or a wafer level chip size package (hereinafter abbreviated to WLCSP), are implemented through use of a component for vertical wiring and/or rewiring, to thereby simplify the manufacturing process. FIGS. 40(A) and 40(B) show a side sectional view and a perspective view of the electronic component for interconnection disclosed in Patent Document 2. This electronic component for interconnection is formed through electroforming such that a plurality of vertical interconnects and horizontal interconnects connected thereto are integrally connected by a support plate formed of an electrically conductive material. Since the electronic component for interconnection is formed through electroforming, after the electronic component for interconnection is incorporated into an electronic device package, the support plate can be easily separated from the wiring portion, such as the horizontal interconnects and the vertical interconnects, through application of heat and/or pressure. Thus, the plurality of vertical interconnects and the horizontal interconnects are connected at predetermined positions.

In general, a semiconductor manufacturing process is divided into a former stage for fabricating an LSI and a latter stage for packaging the LSI. There are a few manufacturers that specialize in the latter stage but can cover the former stage. Manufacture of conventional electronic device packages, such as wafer level chip size package (WLCSP), requires a process of performing rewiring, vertical wiring plating, etc. on a wafer; that is, requires facilities similar to those used in the former stage, and cannot be performed by use of only conventional facilities for the latter stage. However, through employment of an electronic component for interconnection as disclosed in Patent Document 2, the production cost can be reduced by entrusting the production of the component to a dedicated manufacturer. In the case of WLCSP or the like, through replacement of the vertical wiring and/or rewiring forming processes with a component, it becomes possible to put together off line, in the form of a component, processes which require facilities similar to those used in the former stage, to thereby enable manufacturers dedicated for the latter stage to enter into manufacture of such packages without large investment. However, the electronic component for interconnection as disclosed in Patent Document 2 requires a high-cost process such as electroforming or plating. Also, in the case where electroforming is employed, a dedicated apparatus is required to separate a support plate, which results in an increase in the number of steps and cost.

PRIOR ART DOCUMENTS

Patent Documents

Patent Document 1: Japanese Patent No. 4182140
Patent Document 2: Japanese Patent Application Laid-Open (kokai) No. 2009-246104

SUMMARY OF THE INVENTION

Problems to be Solved by the Invention

The present invention has been accomplished so as to solve the above-described problems. An object of the present invention is to enable additional processes required for forming vertical wiring and rewiring in a double face package (DFP) or a wafer level chip size package (WLCSP) to be implemented through use of a component for vertical wiring and rewiring, to thereby simplify the manufacturing process and reduce cost.

Means for Solving the Problems

An electronic component for interconnection of the present invention is incorporated, for use, into an electronic device package in which a circuit element including a semiconductor chip is disposed and which has external electrodes connected to the circuit element via vertical interconnects and horizontal interconnects. This electronic component for interconnection is composed of a wiring substrate which includes horizontal interconnects and vertical interconnects connected to the horizontal interconnects and extending therefrom in a vertical direction; and a support plate to which the wiring substrate having the horizontal interconnects and the vertical interconnects is bonded through use of an adhesive which can be separated with water.

Each of the horizontal interconnects is constituted by an inner interconnect which is directly connected to a vertical interconnect on one face of the wiring substrate, an outer interconnect formed on the opposite face of the wiring substrate, and a via interconnect which penetrates the wiring substrate and connects the inner interconnect and the outer interconnect together. Alternatively, each of the horizontal interconnects is constituted by an inner interconnect which is directly connected to a vertical interconnect on one face of the wiring substrate.

Solder resist is applied to the outer side of the wiring substrate having the outer interconnect, and a support plate is bonded to the wiring substrate via the solder resist. The support plate is formed of an electrically conductive or insulative material which can impart rigidity to the wiring substrate so as to maintain flatness, and the wiring substrate is formed of polyimide or glass epoxy.

According to a method of manufacturing an electronic component for interconnection of the present invention, via interconnects are formed in a wiring substrate such that the via interconnects penetrate the wiring substrate, inner interconnects and outer interconnects to be connected to the via interconnects are formed on the inner and outer sides, respectively, of the wiring substrate. The inner interconnects, the via interconnects, and the outer interconnects constitute horizontal interconnects. There are formed vertical interconnects which are connected to the inner interconnects and extend therefrom in a vertical direction. Solder resist is applied to the side of the wiring substrate where the outer interconnects are formed, excluding regions where openings for external connections are to be formed. The wiring substrate applied with the solder resist is bonded to the support plate through use of an adhesive which can be separated with water.

According to another method of manufacturing an electronic component for interconnection of the present invention, horizontal interconnects are formed on a wiring substrate, vertical interconnects are formed such that they are connected to the horizontal interconnects and extend therefrom in a vertical direction, and the wiring substrate having the horizontal interconnects and the vertical interconnects is bonded to a support plate through use of an adhesive which can be separated with water.

According to another method of manufacturing an electronic component for interconnection of the present invention, there is formed a metal laminate composed of at least three layers including a lower metal layer for horizontal interconnects, an upper metal layer for horizontal interconnects, and a metal layer for vertical interconnects. The lower metal layer for horizontal interconnects is processed into a predetermined pattern, and the metal laminate including the patterned lower metal layer for horizontal interconnects is bonded to the wiring substrate. After that, the metal layer for vertical interconnects is processed into a predetermined pattern, whereby vertical interconnects are formed. While the vertical interconnects are used as a mask, the upper metal layer for horizontal interconnects is processed into a predetermined pattern. The processed lower metal layer for horizontal interconnects and the processed upper metal layer for horizontal interconnects form horizontal interconnects. The wiring substrate having the vertical interconnects and the horizontal interconnects is bonded to a support plate through use of an adhesive which can be separated with water.

Bonding of the wiring substrate to the support plate is performed by the steps of dropping or applying a required amount of a liquid adhesive onto the support plate, irradiating the adhesive with ultraviolet rays, pressing and bonding the wiring substrate to the support plate, and heating them. Alternatively, the wring substrate and the support plate are bonded together so as to form a sheet-shaped assembly, which is then irradiated with ultraviolet rays and heated. The vertical interconnects are formed by the steps of applying resist onto the side of the wiring substrate where the inner interconnects are formed, performing exposure and development so as to form openings for the vertical interconnects, and performing plating while using the inner interconnects as current paths for the plating, to thereby fill the interiors of the openings with a plating metal.

In use, this completed electronic component for interconnection is connected to a substrate on which an LSI or passive components are mounted. However, the support plate of the electronic component for interconnection is finally separated, whereby an electronic device package is completed. For example, the separable adhesive includes an epoxy resin having an ethylene glycol moiety and having an epoxy group at each end, an epoxy resin having a propylene glycol moiety and having an epoxy group at each end, and a cationic polymerization initiator. This adhesive can be readily separated with moisture. In addition to the feature of being readily separated with moisture, this adhesive has an excellent heat resistance. In some cases, solder reflow is performed in a process of manufacturing an electronic component device. In such a case, the electronic component for interconnection is exposed to the reflow temperature; however, the adhesive can endure the reflow temperature. Moreover, when the water used for finally separating the support plate is heated, the time required for separation can be shortened.

Since the support plate can be separated through use of water, stress hardly acts on the support plate, and the support plate can be used again. Thus, cost can be reduced, as compared the case where a conventional disposable support plate is used.

Effects of the Invention

According to the present invention, since the support plate is bonded to the wiring substrate through use of liquid adhesive in the final stage of the process of manufacturing the electronic component for interconnection, special know-how as that required in the case of electroforming is not required. Further, the process of manufacturing the electronic component for interconnection used for a double face package (DFP), a wafer level chip size package (WLCSP), or an IC built-in substrate can be simplified. Moreover, since the support plate can be separated with water, a dedicated separation apparatus or the like becomes unnecessary. Thus, a process of manufacturing an electronic device package using this component can be simplified, which contributes to cost reduction.

BRIEF DESCRIPTION OF THE DRAWINGS

FIGS. 1(A) and 1(B) are views showing a first example of an electronic component for interconnection which embodies the present invention, wherein FIG. 1(A) shows a side cross-sectional view of a unit structure for a single electronic device package, and FIG. 1(B) shows a perspective view of the unit structure.

FIGS. 34(A) and 34(B) are views showing a state in which an LSI chip is bonded to a substrate and connected thereto, wherein FIG. 34(A) shows a sectional view, and FIG. 34(B) shows a perspective view.

BEST MODE FOR CARRYING OUT THE INVENTION

Figure 1A:
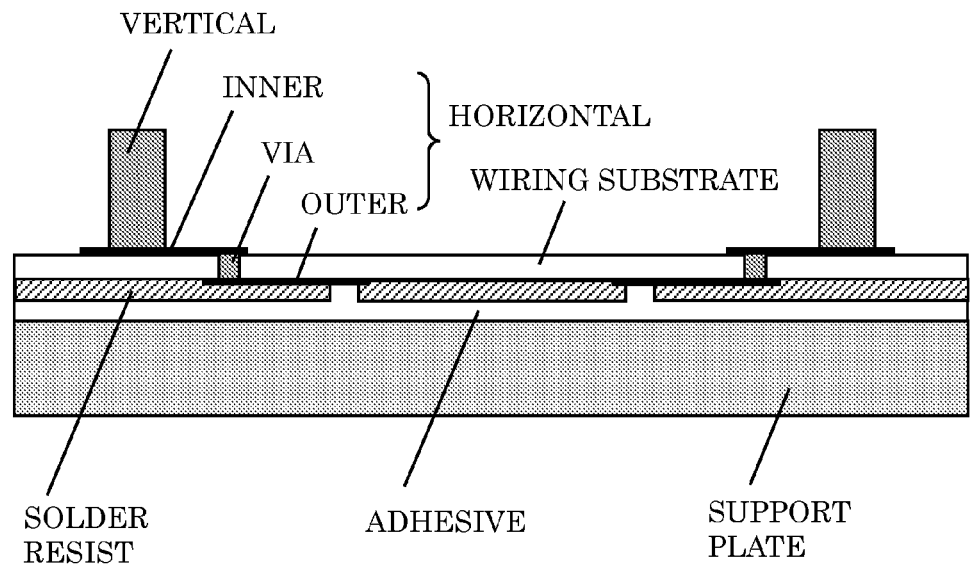
Figure 1B:
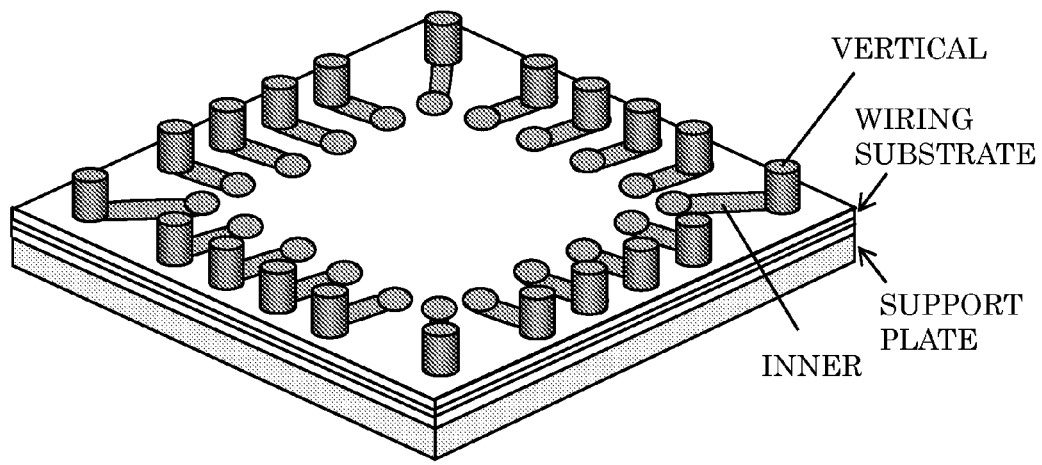

The present invention will now be described by way of example. FIGS. 1(A) and 1(B) are views showing a first example of an electronic component for interconnection which embodies the present invention, wherein FIG. 1(A) shows a side cross-sectional view of a unit structure for a single electronic device package, and FIG. 1(B) shows a perspective view of the unit structure. Although these drawings show a single unit structure, in an actual manufacturing process, a large number of unit structures are assembled in a connected state, and are separated from one another through dicing in the final stage or a stage close to the final stage. As shown in FIGS. 1(A) and 1(B), the unit structure includes horizontal interconnects provided on a wring substrate, and vertical interconnects connected thereto. Each of the illustrated horizontal interconnects is composed of an inner interconnect formed on the inner side of the wring substrate, an outer interconnect formed on the opposite side thereof, and a via interconnect which penetrates the wring substrate so as to connect the inner interconnect and the outer interconnect together. In the present specification, the side of the wring substrate to which the vertical interconnects are connected will be referred to as the inner side of the wiring substrate, and the opposite side thereof to which a support plate is connected will be referred to as the outer side of the wiring substrate. When the electronic component for interconnection is incorporated into an electronic device package, as shown in, for example, FIG. 30, the side toward the support plate becomes the outer side. These interconnects (inner, via, and outer interconnects) constitute a horizontal interconnect for rewiring which extends from a certain vertical interconnect to an arbitrary position of the outer side of the wring substrate. Solder resist is applied onto the outer side of the wring substrate having such outer interconnects, and the support plate is then boned to the wiring substrate through use of an adhesive which is easily separated with hot water and which contains an epoxy resin A having an ethylene glycol moiety and having an epoxy group at each end, an epoxy resin B having a propylene glycol moiety and having an epoxy group at each end, and a cationic polymerization initiator C. Furthermore, polyethylene glycol or polypropylene glycol D having a molecular weight of 200 to 10,000 may be added. No particular limitation is imposed on the ratio of the above-mentioned ingredients A, B, C, and D. When the amount of the ingredient A is 100 parts by weight, the amount of the ingredient B is 10 to 70 parts by weight, and the amount of the ingredient D is 10 to 80 parts by weight. The amount of the cationic photoinitiator C is 0.1 to 10 parts by weight with respect to the sum of the amounts of the ingredients A and B. The temperature of water used for separating the present adhesive is 30 to 85° C., more preferably, 40 to 80° C.

The support plate may be formed of any electrically conductive or electrically insulative material, so long as the material can impart a sufficient degree of rigidity to the wring substrate to thereby maintain flatness. For example, the support plate may be formed of a stainless-steel plate which is excellent in flatness. In use, such a wring substrate is incorporated into an electronic device package. At that time, a large number of wiring substrates as shown in the drawings, which are connected together, are incorporated into individual electronic device packages, and are diced into individual devices in the final stage of the manufacturing process or in a stage close to the final stage. Therefore, when the large number of connected wring substrates are incorporated into individual electronic device packages, the wiring substrates require a support plate having some degree of rigidity.

Figure 2:
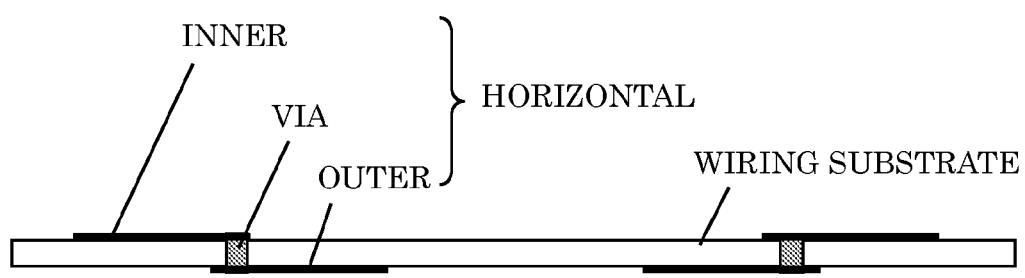
FIG. 2 is a view of a wiring substrate with wiring formed on opposite sides thereof.

Next, manufacture of the electronic component for interconnection as shown in FIGS. 1(A) and 1(B) will be described with reference to FIGS. 2 to 10. FIG. 2 is a view of a wring substrate with wiring formed on opposite sides thereof. Examples of the material of the wiring substrate include polyimide and glass epoxy (pre-preg of a material containing glass fibers impregnated with epoxy resin). Via interconnects which penetrate the wring substrate are formed therein through use of, for example, copper (Cu). Also, inner interconnects and outer interconnects which are to be connected to the via interconnects are formed on the inner and outer side, respectively, of the wring substrate through use of, for example, copper (Cu). The inner interconnects, the via interconnects, and the outer interconnects constitute horizontal interconnects.

Figure 3:
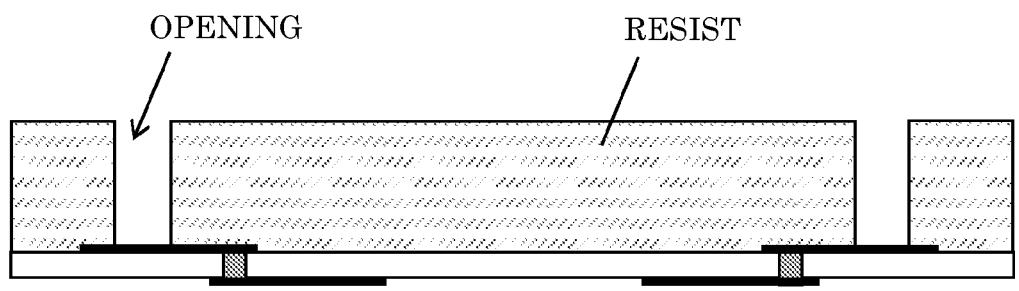
FIG. 3 is a view used for explaining application of resist for forming vertical interconnects and formation of openings for the vertical interconnects.

Next, as shown in FIG. 3, resist for forming vertical interconnects is applied, and exposure and development are performed so as to form openings for the vertical interconnects.

Figure 4:
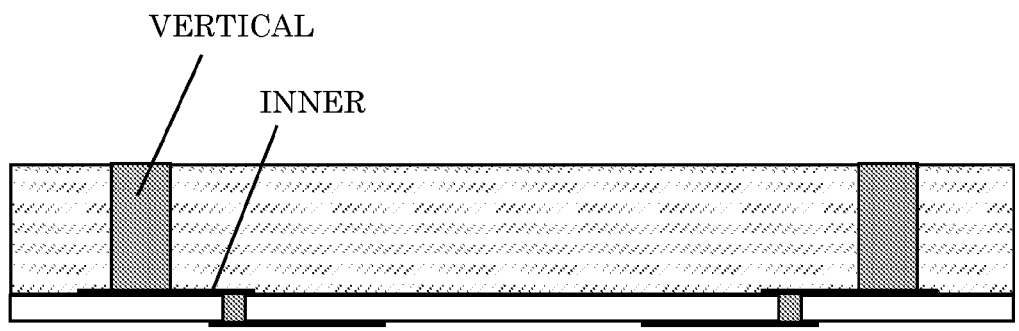
FIG. 4 is a view showing a state in which the openings are filled with plating metal.

Next, as shown in FIG. 4, while the inner interconnects are utilized as current paths for plating, plating for forming the vertical interconnects is performed. As a result, the interiors of the openings are filled with a plating metal (e.g., copper (Cu) which is the same material as the horizontal interconnects).

Figure 5:
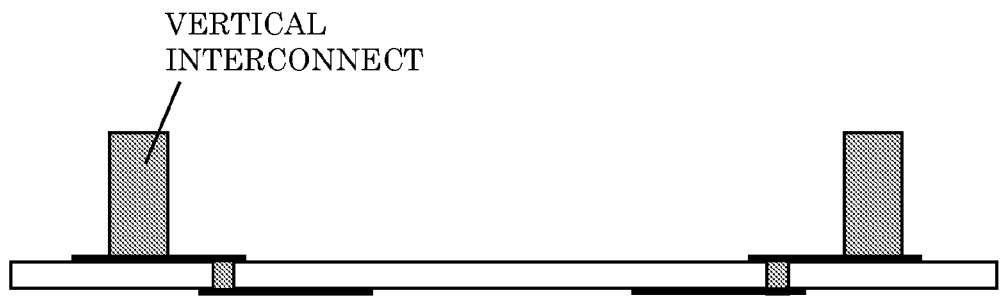
FIG. 5 is a view showing a state in which the resist for forming the vertical interconnects is removed.

Next, as shown in FIG. 5, the resist for the vertical interconnects is removed. As described above, the vertical interconnects can be formed by lithography. Alternatively, the vertical interconnects may be formed as follows. A mask (for example, resist mask, plastic mask, or metal mask) having openings corresponding to the vertical interconnects is placed on the wiring substrate shown in FIG. 2, and an electrically conductive paste (e.g., copper paste) is charged into the openings. Subsequently, the circumferences of the formed vertical interconnects are plated for the purpose of reinforcement and resistance reduction.

Figure 6:
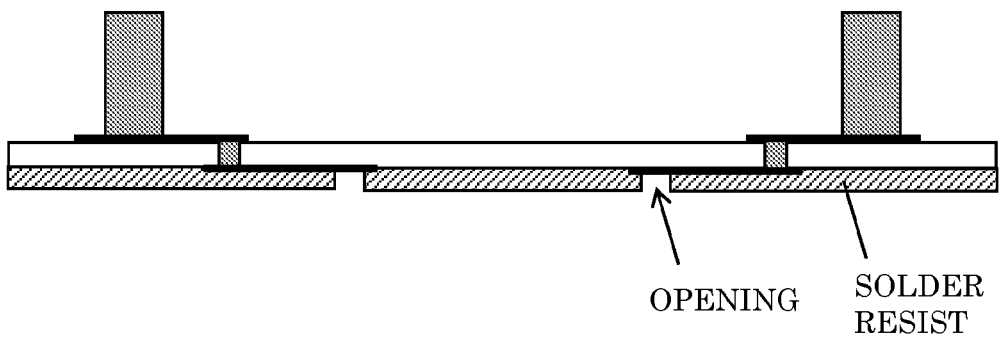
FIG. 6 is a view used for explaining application of solder resist on the outer side of the wring substrate.

Next, as shown in FIG. 6, solder resist is applied to the outer side of the wring substrate such that openings are formed at positions where pump electrodes (see FIG. 33) are to be formed. The solder resist is a heat resisting coating material which is applied to a specific region of the surface of an electronic circuit board. For example, the solder resist is formed of a known material, such as resin, which is applied to regions so as to prevent adhesion of solder to the regions in a solder application process.

Figure 7:
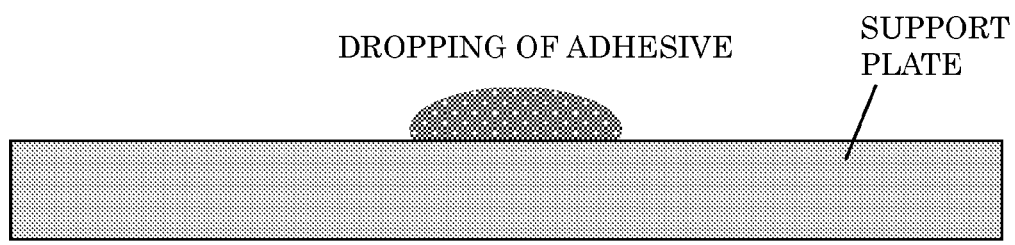
FIG. 7 is a view showing dropping of adhesive onto a support plate.

Next, a support plate is bonded to the outer side of the wring substrate. Fur such bonding, as shown in FIG. 7, a required amount of liquid adhesive is dropped or applied onto the support plate of stainless steel (SUS).

Figure 8:
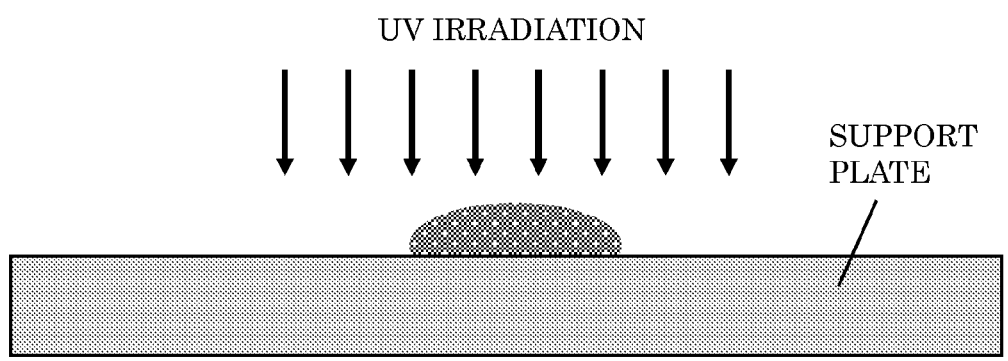
FIG. 8 is a view used for explaining application of ultraviolet rays.
Figure 9:
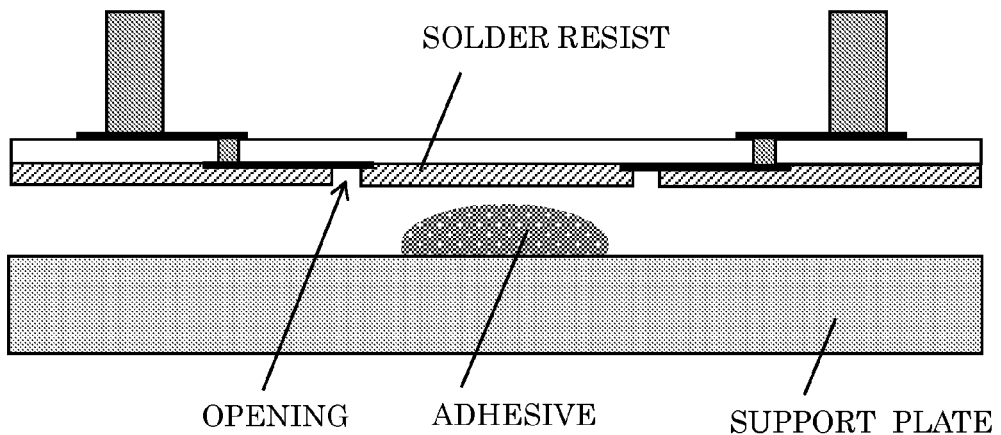
FIG. 9 is a view showing a state before the wring substrate is bonded to the support plate.
Figure 10:
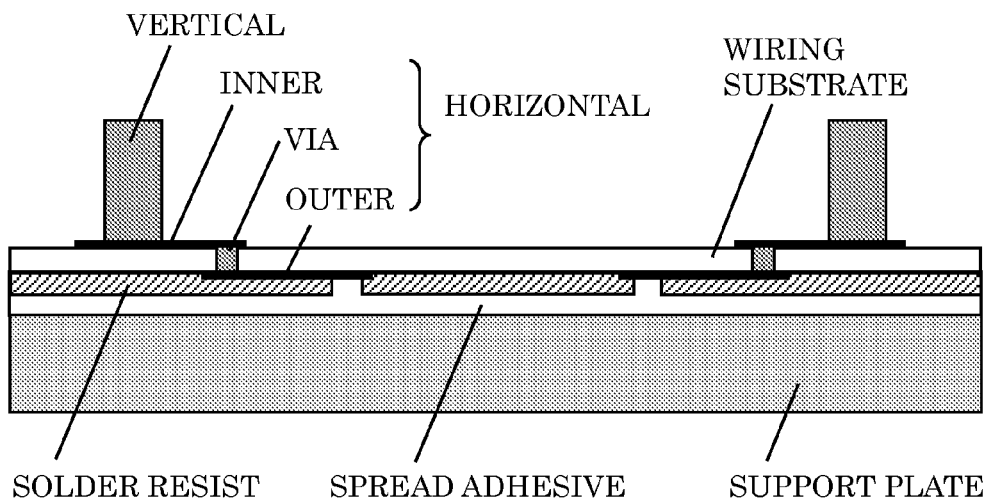
FIG. 10 is a view showing a state after the wring substrate is bonded to the support plate.

Next, as shown in FIG. 8, in order to cause the adhesive to develop a property that the adhesive can be separated with moisture, the adhesive is irradiated with ultraviolet rays. A lamp to be used is a high-pressure mercury lamp or a metal halide lamp. The amount of irradiation is 1500 to 4500 mj (reduced value at 365 nm). Next, the wring substrate with the applied solder resist is aligned with and placed on the support plate with the adhesive applied thereto. Subsequently, the wring substrate is pressed and bonded to the support plate, followed by heating. Preferably, the temperature of the heating for the purpose of curing the adhesive is about 85 degrees. Alternatively, the wring substrate and the support plate are bonded together so as to form a sheet-shaped assembly, which is then irradiated with ultraviolet rays and heated. FIG. 9 is a view showing a state before the wring substrate is bonded to the support plate. FIG. 10 is a view showing a state after the wring substrate is bonded to the support plate. After the bonding, the liquid adhesive is spread over the entire interface between the support plate and the wring substrate. The solder resist layer provided on the wring substrate has an unevenness of several tens of microns or greater because of formation of the openings for external electrodes. Use of liquid adhesive is preferred from the viewpoint of absorbing the unevenness. Also, since the parallelism between the support plate and the wring substrate is important, spherical spacers (e.g., Micropearl, product of Sekisui Chemical Co. Ltd.) may be added to the liquid adhesive. The spacers have a size of about 10 μm to 100 μm. For 100 parts by weight of the adhesive, the spacer is added in an amount of 0.01 parts by weight to 5 parts by weight.

Thus, as shown in FIG. 10, the first example of the electronic component for interconnection is completed. The completed component is the same as that having been described with reference to FIGS. 1(A) and 1(B). The adhesive used in the manufacture of the component has characteristics that, after being cured, it swells with moisture. Specifically, when the adhesive comes into contact with moisture, it absorbs moisture and swells. After being incorporated into an electronic device package, the electronic component for interconnection is brought into contact with moisture so as to swell the adhesive, whereby the adhesive loses its adhesive force. Therefore, the adhesive separates by itself upon immersion in water. The time required for separation can be shortened by raising the temperature of the water. As described above, the adhesive used for bonding the support plate to the outer side of the wring substrate separates upon contact with moisture, it is desired to prevent the adhesive from coming into contact with moisture in the middle of manufacture of an electronic component. Therefore, desirably, the wiring substrate and the support plate are bonded together at the final stage after the horizontal interconnects and the vertical interconnects are formed.

In order to facilitate the separation, the front and back surfaces of the support plate may be coated with the adhesive in advance through coating or dipping, which is then heated and dried after UV irradiation. If sealing resin flows onto the side surface of the support plate at the time of resin sealing (see FIG. 31), there arises a possibility that the adhesive is not exposed to the surface and does not come into moisture in the separation step. The purpose of applying the adhesive to the front and back surfaces of the support plate is to avoid such a possibility. That is, by means of covering the side and top surfaces of the support plate with easily separable adhesive, it is possible to secure a surface which comes into contact with water without fail, even when the sealing resin flows onto the side surface of the support plate and a portion of the top surface thereof. Thus, separation of the support plate is facilitated.

Figure 11:
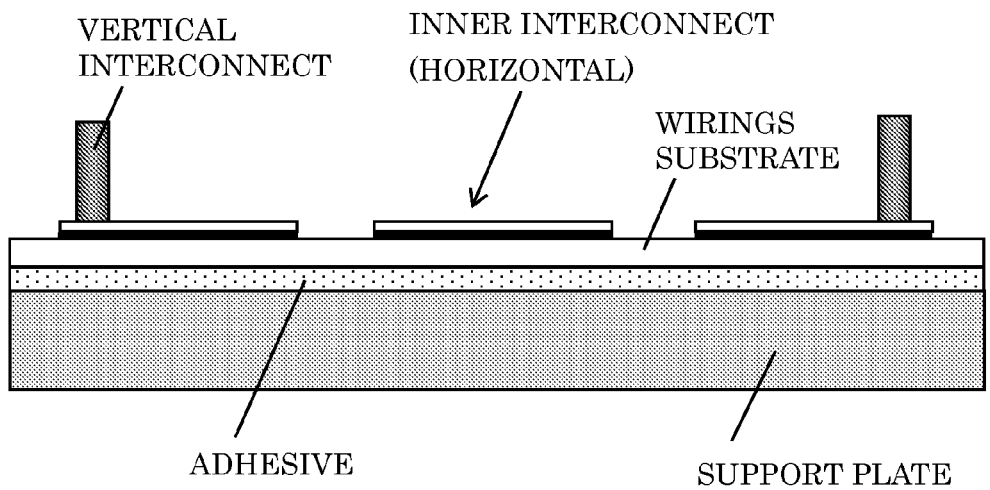
FIG. 11 is a view showing a second example of the electronic component for interconnection which embodies the present invention, the view being a side cross-sectional view of a unit structure for a single electronic device package.

FIG. 11 is a view showing a second example of the electronic component for interconnection which embodies the present invention, the view being a side cross-sectional view of a unit structure for a single electronic device package. The illustrated second example of the electronic component for interconnection has inner interconnects on the inner side of the wring substrate as in the case of the first example; however, the second example differs from the first example in that no outer interconnect is provided on the outer side of the wring substrate. That is, the horizontal interconnects are constituted by the inner interconnects only. As in the case of the first example, the vertical interconnects are connected to the inner interconnects. As in the case of the first example, a support plate is bonded to the outer side of the wring substrate through use of adhesive which is readily separated with hot water.

Figure 12:
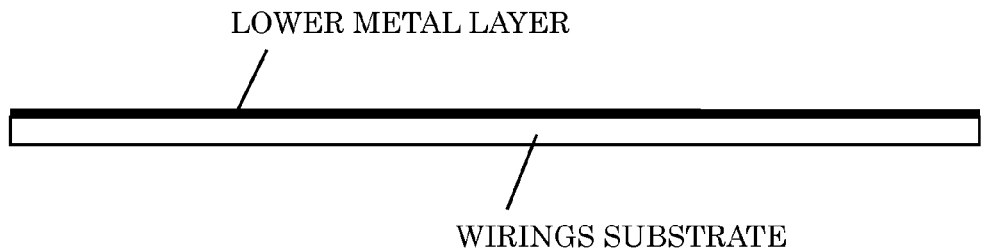
FIG. 12 is a view showing a wring substrate with a lower metal layer provided thereon.

Next, manufacture of the electronic component for interconnection as shown in FIG. 11 will be described with reference to FIGS. 12 to 21. First, as illustrated in FIG. 12, a wiring substrate having a lower metal layer (for example, copper-clad polyimide substrate) is prepared.

Figure 13:
FIG. 13 is a view used for explaining processing of an upper metal layer.

Next, as shown in FIG. 13, an upper metal layer is provided on the copper foil (lower metal layer). The upper metal layer is formed of a material different from that of the lower metal layer (i.e., nickel (Ni) in the case where the lower metal layer is formed of copper foil). This upper metal layer may be formed of any metal so long as the upper metal layer can be used as a mask when the lower copper-foil layer is etched as will be described later. Example combinations of the lower layer metal and the upper layer metal include not only the above-mentioned combination of copper and nickel, but also other combinations such as Cu and Au, Ag or Cr and Cu, Cr and Ni. No limitation is imposed on the combination so long as materials which provide high etching selectivity are combined.

The upper metal layer is formed by a process similar to a process of forming vertical interconnects, which will be described later. Specifically, resist is applied to the lower metal layer (copper foil), and exposure and development are performed so as to form openings in the resist layer in a pattern corresponding to the pattern of the horizontal interconnects. Furthermore, while the lower metal layer is utilized as a current path for plating, the interiors of the openings can be filled with a metal. In this stage, openings for bump electrodes (see FIG. 39) may be formed in the wiring substrate in advance.

Figure 14:
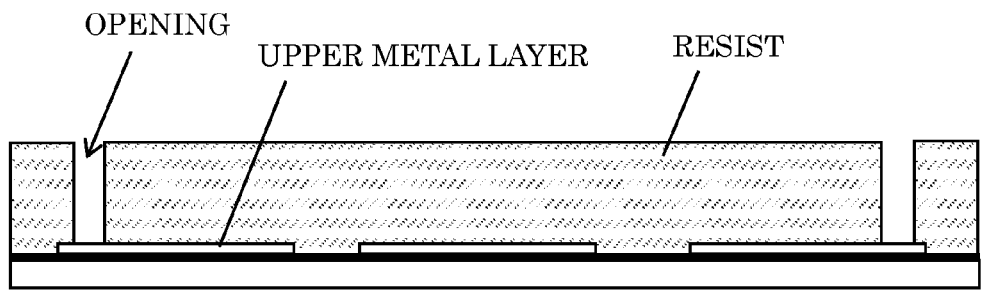
FIG. 14 is a view used for explaining application of resist for forming vertical interconnects and formation of openings for the vertical interconnects.

Next, as shown in FIG. 14, resist for forming vertical interconnects is applied, and exposure and development are performed so as to form openings for the vertical interconnects.

Figure 15:
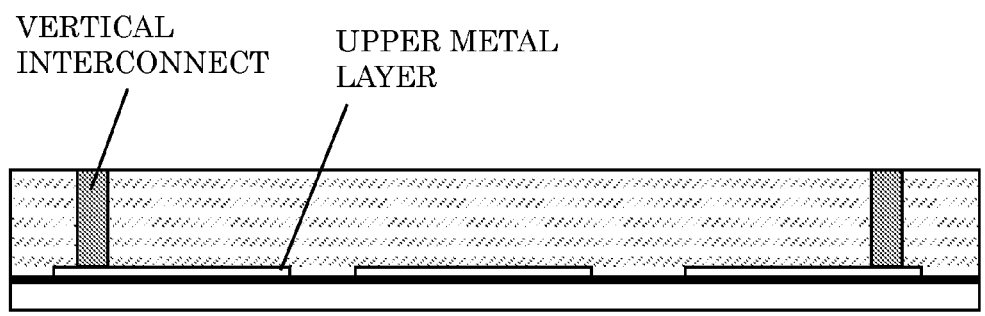
FIG. 15 is a view showing a state in which the openings are filled with plating metal as a result of plating for the vertical interconnects.

Next, as shown in FIG. 15, while the upper metal layer is utilized as a current path for plating, plating for forming the vertical interconnects is performed. As a result, the interiors of the openings are filled with a plating metal (e.g., nickel (Ni) which is the same material as that of the upper metal layer).

Figure 16:
FIG. 16 is a view showing a state in which the resist for forming the vertical interconnects is removed.

Next, as shown in FIG. 16, the resist for the vertical interconnects is removed.

Figure 17:
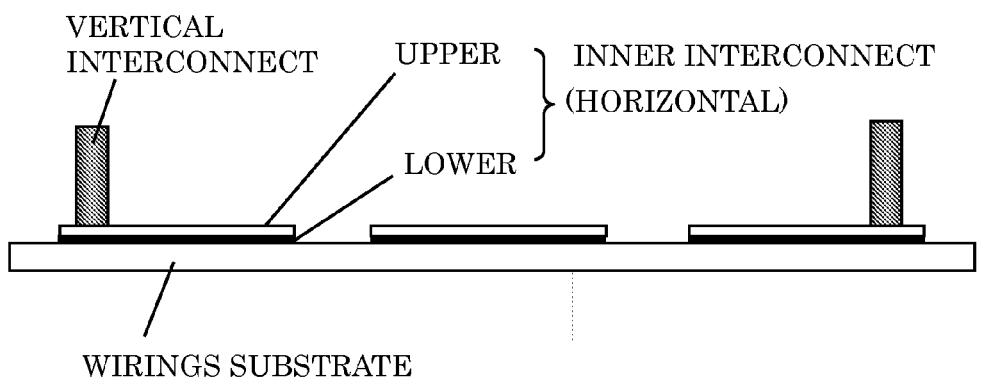
FIG. 17 is a view used for explaining etching of the lower metal layer.

Next, as shown in FIG. 17, while the patterned upper metal layer is used as a mask, the lower metal layer is etched. Appropriate selection of etchant enables only the lower metal layer to be etched without etching the metal layer for the vertical interconnects or the upper metal layer. As a result, both the lower and upper metal layers have the completely identical pattern, and are superimposed in an aligned condition. These two layers constitute the inner interconnects (horizontal interconnects).

Figure 18:
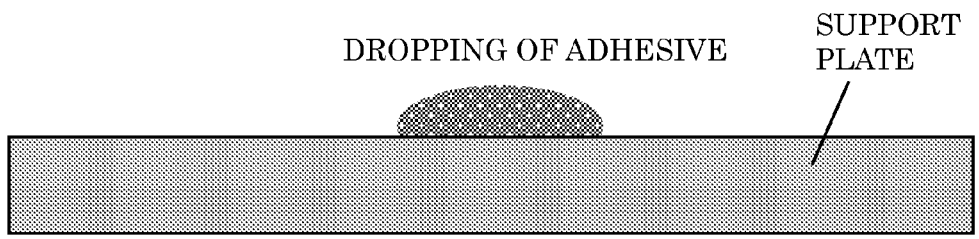
FIG. 18 is a view showing dropping of adhesive onto a support plate.

Next, a support plate is bonded to the outer side of the wring substrate. Fur such bonding, as shown in FIG. 18, a required amount of liquid adhesive is dropped or applied onto the support plate of stainless steel (SUS).

Figure 19:
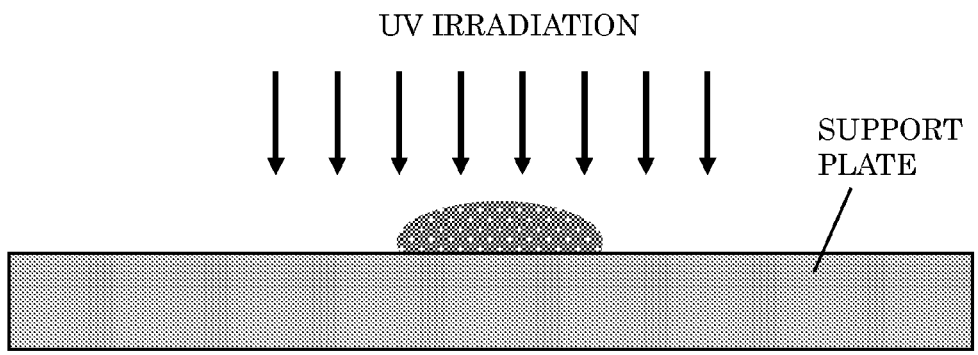
FIG. 19 is a view used for explaining application of ultraviolet rays.

Next, as shown in FIG. 19, the adhesive is irradiated with ultraviolet rays.

Figure 20:
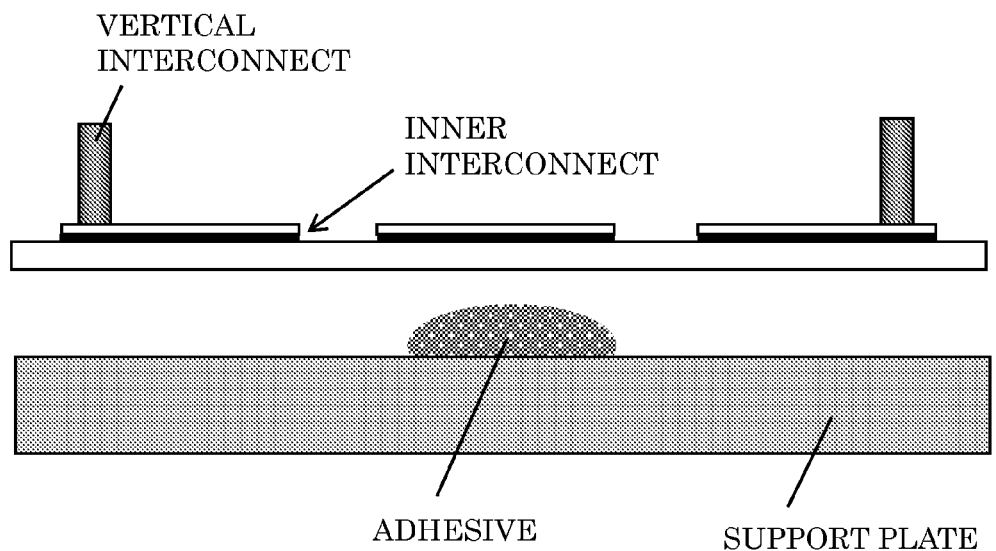
FIG. 20 is a view showing a state before the wring substrate is bonded to the support plate.
Figure 21:
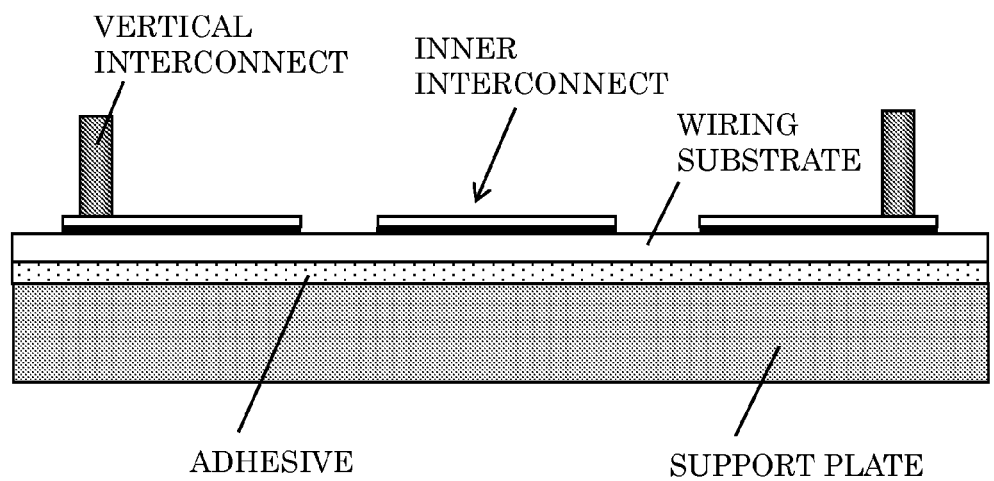
FIG. 21 is a view showing a state after the wring substrate is bonded to the support plate.

Next, as shown in FIG. 20, the wring substrate formed as shown in FIG. 17 is aligned with and placed on the support plate on which the adhesive has been dropped or applied. Subsequently, the wring substrate is pressed and bonded to the support plate, followed by heating. Alternatively, the wring substrate and the support plate are bonded together so as to form a sheet-shaped assembly, which is then irradiated with ultraviolet rays and heated. FIG. 20 is a view showing a state before the wring substrate is bonded to the support plate. FIG. 21 is a view showing a state after the wring substrate is bonded to the support plate. The liquid adhesive is spread over the entire interface between the support plate and the wring substrate.

Thus, as shown in FIG. 21, the second example of the electronic component for interconnection is completed. The completed component is the same as that having been described with reference to FIG. 11. The adhesive used in the manufacture of the component is the same as that described in the first example, and is readily separated with hot water.

Figure 22:
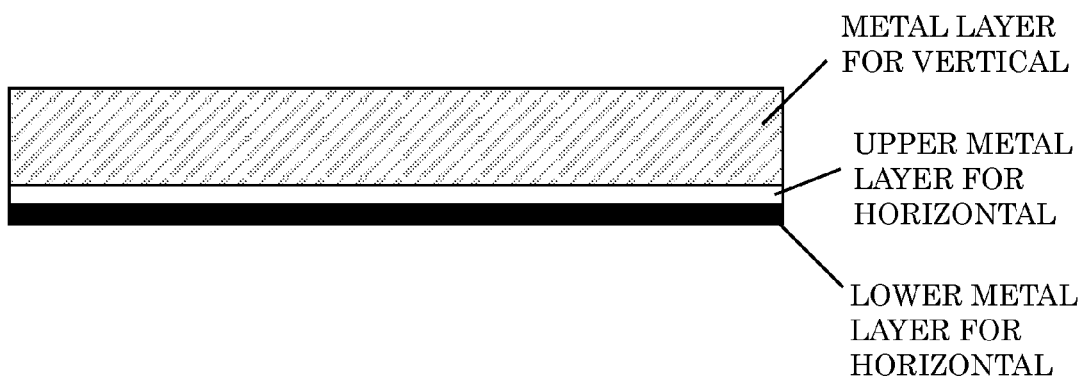
FIG. 22 is a view exemplifying a metal laminate including three metal layers.

Next, manufacture of a third example of the electronic component for interconnection which embodies the present invention will be described with reference to FIGS. 22 to 28. First, as shown in FIG. 22, there is formed a metal laminate composed of a lower metal layer for horizontal interconnects (e.g., thin copper layer), an upper metal layer for horizontal interconnects (e.g., thin nickel layer), and a layer of metal for vertical interconnects (e.g., thick copper layer). For example, the laminate is a clad plate composed of three metal layers bonded together. As is well known, the clad plate is a metal plate formed by bonding different types of metal sheets through press bonding. The metal laminate is not limited to the clad plate, and any metal laminate, such as a metal laminate formed through plating may be used, so long as the metal laminate includes three metal layers laminated together. The lower metal layer for horizontal interconnects and the upper metal layer for horizontal interconnects must have electrical conductivity. In addition, the lower metal layer for horizontal interconnects must be formed of a metal which enables the lower metal layer to be used as a mask when the upper metal layer for horizontal interconnects is etched. Example combinations of the metal of the lower metal layer for horizontal interconnects and the metal of the upper metal layer for horizontal interconnects include not only the above-mentioned combination of copper and nickel, but also other combinations such as Cu and Au, Ag or Cr and Cu, Cr and Ni. No limitation is imposed on the combination so long as materials which provide high etching selectivity are combined. Also, no problem occurs even when the metal for the vertical interconnects is the same as that of the lower metal layer for horizontal interconnects, so long as the metal for the vertical interconnects differs from that of the upper metal layer for horizontal interconnects. For example, electrically conductive metal such as copper can be used. Also, it is not necessarily required to form each of the lower metal layer for horizontal interconnects and the upper metal layer for horizontal interconnects by a single metal layer, and a layer of metal having excellent electrical conductivity, such as Au or Ag, may be formed on either surface thereof.

Figure 23:
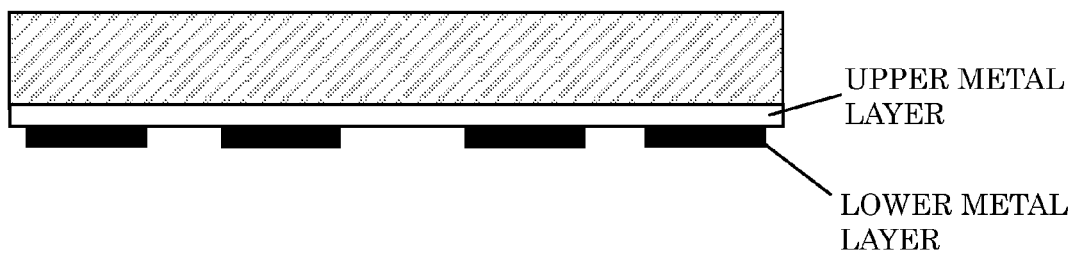
FIG. 23 is a view showing formation of a patterned lower metal layer for horizontal interconnects.

FIG. 23 shows formation of a patterned lower metal layer for horizontal interconnects. The formation of the patterned lower metal layer is performed by lithography. At this time, the metal (e.g., nickel) of the upper metal layer for horizontal interconnects is selected from metals which differ in etching rate from the metal (e.g., copper) of the lower metal layer for horizontal interconnects. Appropriate selection of etchant enables only the lower metal layer for horizontal interconnects to be etched without etching the upper metal layer for horizontal interconnects. Also, the upper metal layer for horizontal interconnects functions as an etching stopper. Therefore, the metal layer for vertical interconnects is not etched even in the case where both the metal layer for vertical interconnects and the lower metal layer for horizontal interconnects are formed of the same metal (e.g., copper).

Figure 24:
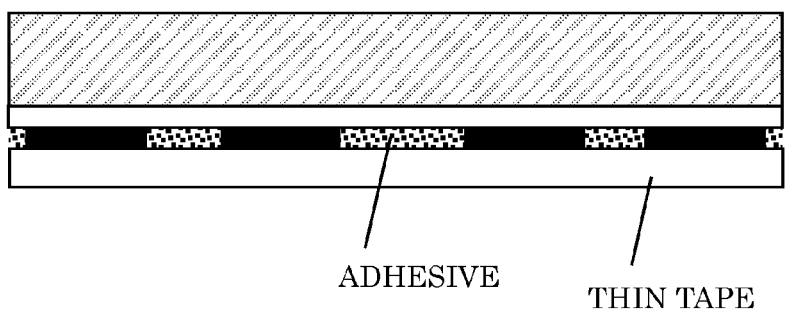
FIG. 24 is a view showing a state in which the metal laminate is bonded to a thin tape.

Next, as shown in FIG. 24, the metal laminate having the patterned lower metal layer is bonded to a thin tape functioning as a wiring substrate through use of adhesive having a high bonding strength. In a completed product (electronic device package), the thin tape functions as a protection film which covers a horizontal wiring portion (rewiring).

Figure 39:
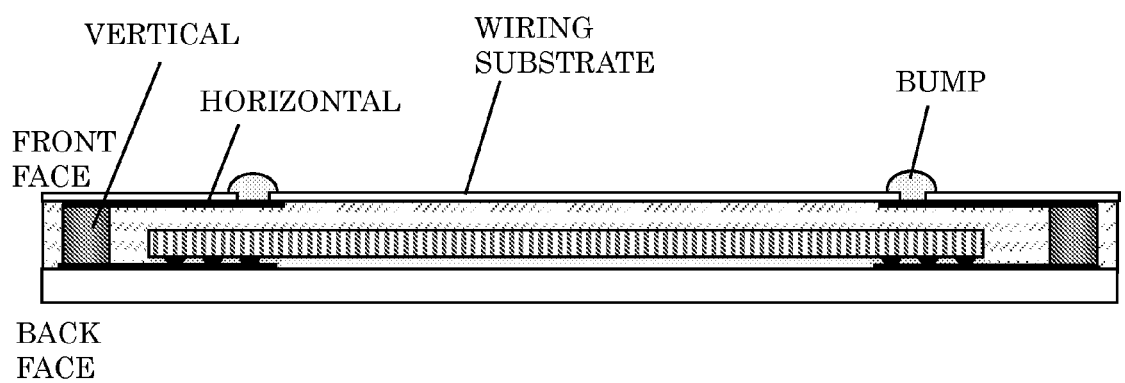
FIG. 39 is a sectional view showing a completed electronic device package.
Figure 40A:
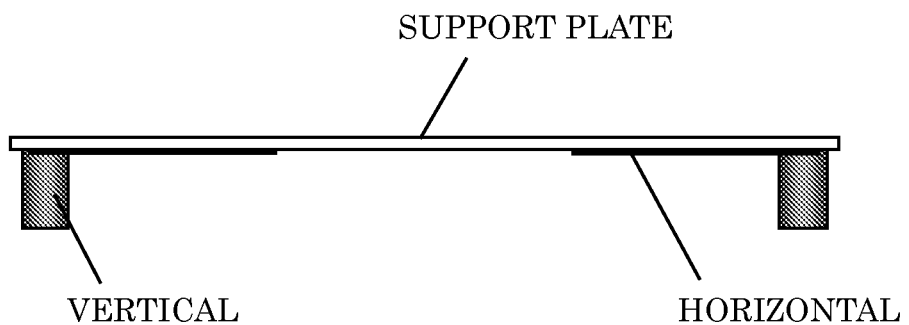
FIGS. 40(A) and 40(B) are a side sectional view and a perspective view showing the electronic component for interconnection disclosed in Patent Document 2.
Figure 40B:
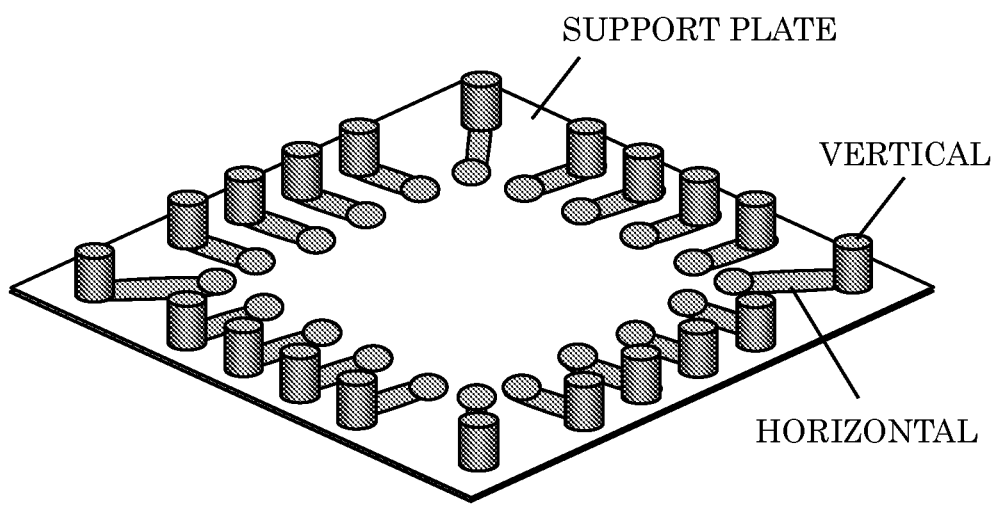

Also, in this stage, openings may be formed in the thin tape at positions where bump electrodes (see FIG. 39) are formed. Alternatively, as shown in FIG. 39, the openings may be formed before solder balls (bump electrodes) are bonded in the final stage of a package manufacturing process.

Figure 25:
FIG. 25 is a sectional view showing a state in which the vertical interconnection portions are formed through patterning.

Next, as shown in FIG. 25, formation of vertical interconnects is performed. This formation of the vertical interconnects is performed by lithography. Specifically, resist for forming vertical interconnects is applied to the surface of the metal layer for vertical interconnects, and exposure and development are performed, followed by etching. Subsequently, the resist is removed, whereby the vertical interconnects are completed. Through appropriate selection of etchant, it becomes possible to etch only the metal layer for vertical interconnects without etching the upper metal layer for horizontal interconnects.

Figure 26:
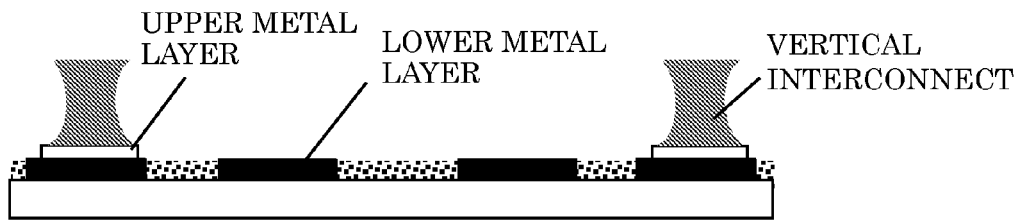
FIG. 26 is a view showing a state in which the upper metal layer for horizontal interconnects is patterned.

Next, as shown in FIG. 26, patterning of the upper metal layer for horizontal interconnects is performed. Specifically, the entire surface of the upper metal layer is etched with the vertical interconnects used as a mask. As a result, the upper metal layer is removed from regions other than those immediately below the vertical interconnects. The horizontal interconnects are formed by the lower metal layer patterned as described above, and portions of the upper metal layer located immediately below the vertical interconnects.

Figure 27:
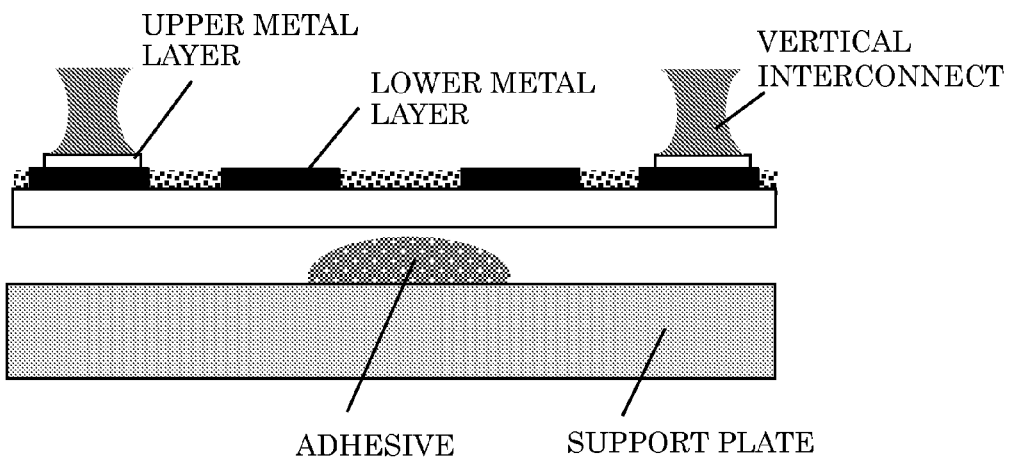
FIG. 27 is a view showing a state before the wring substrate is boned onto a support plate.
Figure 28:
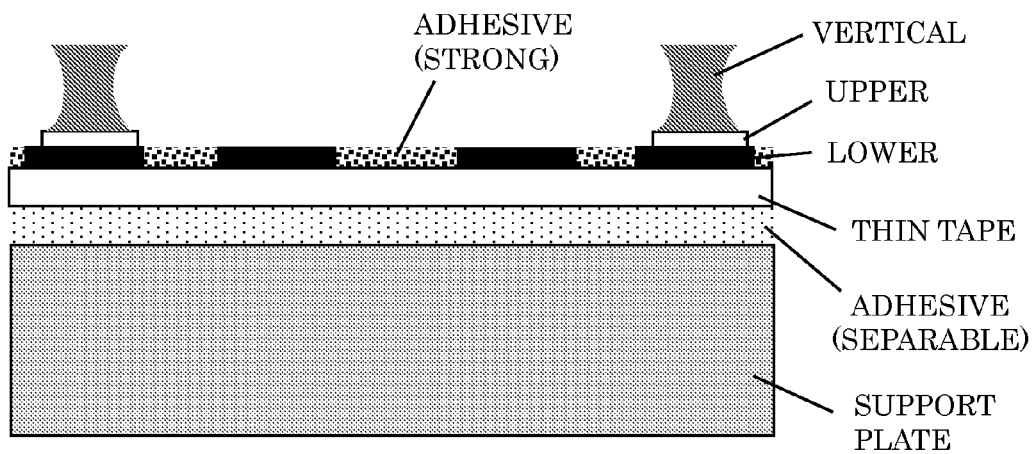
FIG. 28 is a sectional view showing a third example of the completed electronic component for interconnection.

Next, a support plate is bonded to the outer side of the thin tape (functioning as a wiring substrate). For such bonding, as in the above-described first and second examples, a required amount of liquid adhesive is dropped or applied onto the support plate of stainless steel (SUS), and is then irradiated with ultraviolet rays. Subsequently, the thin tape is aligned with and placed on the support plate applied with the adhesive. Subsequently, the thin tape is pressed and bonded to the support plate, followed by heating. Alternatively, the thin tape and the support plate are bonded together so as to form a sheet-shaped assembly, which is then irradiated with ultraviolet rays and heated. FIG. 27 is a view showing a state before the thin tape is bonded to the support plate. FIG. 28 is a view showing a state after the thin tape is bonded to the support plate. The liquid adhesive is spread over the entire interface between the support plate and the wring substrate. Thus, as shown in FIG. 28, the third example of the electronic component for interconnection is completed. The adhesive used in the manufacture of the component is the same as that described in the first or second example and is readily separated with hot water. The support plate is separated and removed after a resin sealing for manufacture of an electronic device package.

The above-described electronic component for interconnection of the present invention can be incorporated into various types of electronic device packages. In the below, an example in which the electronic component for interconnection of the first example is incorporated into an electronic device package of an organic substrate type will be described as Example 1, and an example in which the electronic component for interconnection of the second example is incorporated into an electronic device package of a single-sided wiring substrate type will be described as Example 2. The electronic component for interconnection of the present invention can be incorporated not only into the device packages of Examples 1 and 2, but also into other various types of electronic device packages such as a lead-frame-type electronic device package as disclosed in Patent Document 1, and a wafer level chip size package.

EXAMPLE 1

Figure 29:
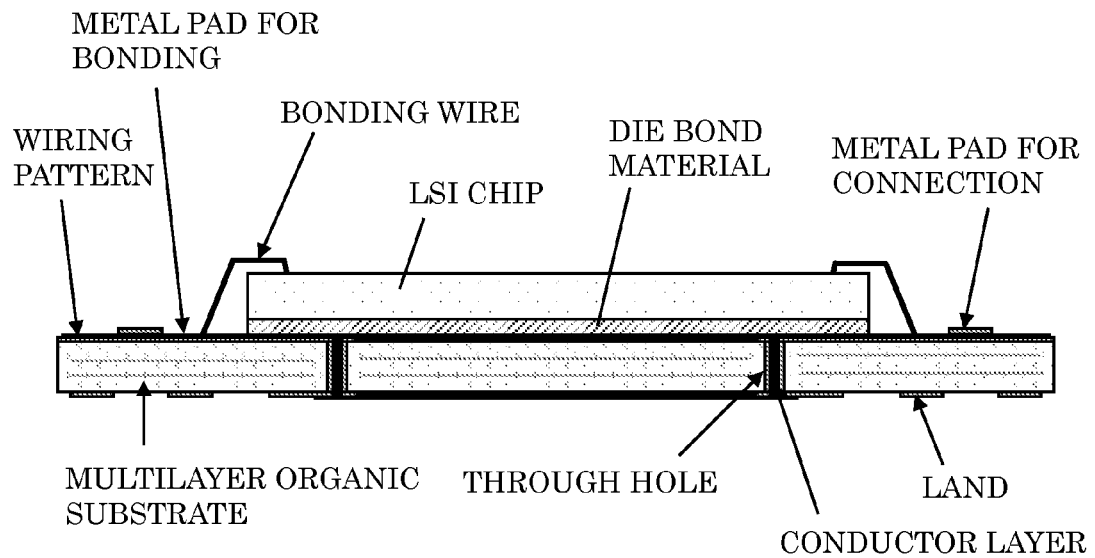
FIG. 29 is a view showing a state in which an LSI chip is bonded and connected to a multilayer organic substrate.

Manufacture of an organic-substrate-type electronic device package including the electronic component for interconnection of the first example (see FIGS. 1(A) and 1(B)) will be described with reference to FIGS. 29 to 33. FIG. 29 is a view showing a state in which an LSI chip is bonded and connected to a multilayer organic substrate. FIG. 29 exemplifies a case where the LSI chip is bonded to the multilayer organic substrate by use of a die bond material, and is connected to a wiring pattern (wiring layer) of the uppermost layer of the organic substrate by use of bonding wires. Metal pad portions for bonding, which serve as bonding wire connection electrodes, are formed on the wiring pattern of the uppermost layer of a multilayer or single-layer organic substrate, and wiring extending to the pad portions is formed. The metal pad portions on the inner side of the multilayer or single-layer organic substrate and the LSI chip are connected together by means of Au bonding wires. Alternatively, the LSI chip can be flip-chip-bond connected to the organic substrate (not shown).

The single-layer organic substrate may have a single-layer, double-layer wiring structure, and the multilayer organic substrate may be formed by forming a wiring pattern on each of a plurality of layers, bonding these layers together, and optionally forming through holes for connecting the wiring patterns of the layers. Conductor layers are formed in the through holes, and connected to lands formed on the outer side surface and serving as end surface electrode portions.

Figure 30:
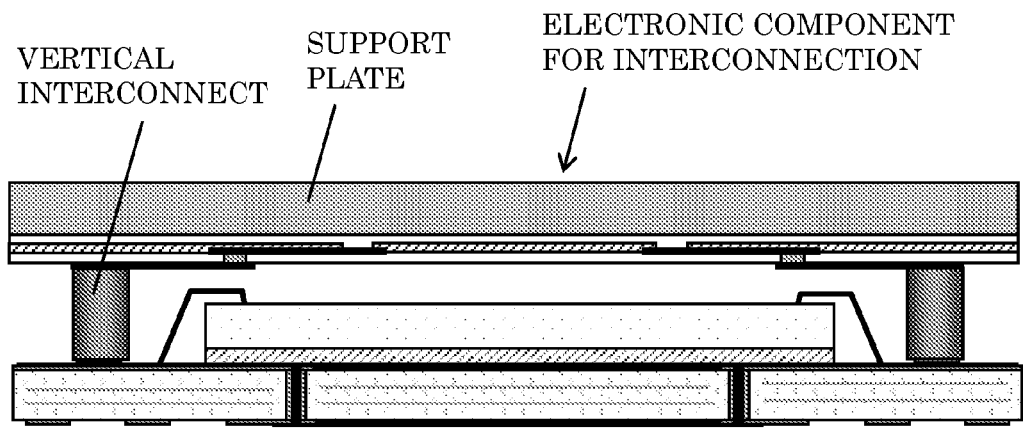
FIG. 30 is a view showing a state in which the vertical interconnects of an electronic component for interconnection are fixed and connected to the multilayer organic substrate.

FIG. 30 is a view showing a state in which the vertical interconnects of the electronic component for interconnection shown in FIGS. 1(A) and 1(B) are fixed and connected to the multilayer organic substrate carrying the LSI chip bonded and connected thereto. The vertical interconnects are fixed to and electrically connected to the wiring pattern of the organic substrate at predetermined locations by means of, for example, soldering or electrically conductive paste such as silver paste. In a state where the vertical interconnects have been fixed to metal pad portions for connection electrodes provided on the wiring pattern of the organic substrate at predetermined locations, all the vertical interconnects are connected together by the plate-shaped support plate.

Figure 31:
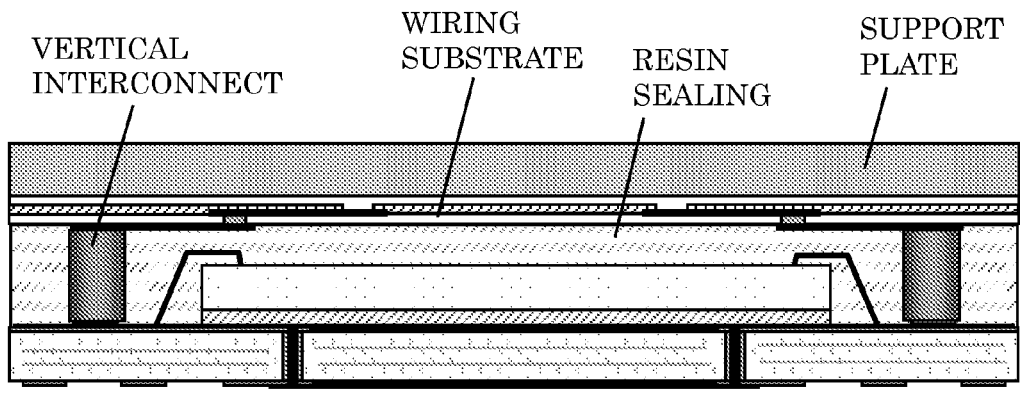
FIG. 31 is a view showing a state after performance of resin sealing.

FIG. 31 is a view showing a state after performance of resin sealing. After the vertical interconnects of the electronic component for interconnection, which are connected together, are fixed, in this state, the upper surface of the organic substrate is transfer-molded, or resin-sealed by use of a liquid resin (e.g., epoxy resin), up to the lower surface of the wiring substrate.

Figure 32:
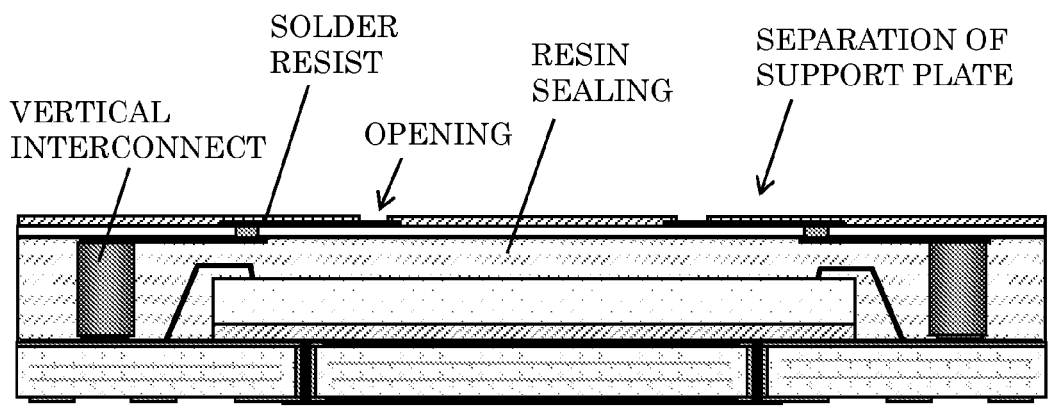
FIG. 32 is a view showing a state after the support plate is separated.

FIG. 32 is a view showing a state after separation of the support plate. As described above, the support plate of the electronic component for interconnection of the present invention is bonded through use of adhesive which is readily separated with hot water. When the entire structure shown in FIG. 31 is immersed into water or hot water so as to swell the adhesive, the adhesive loses its bonding force, whereby the support plate separates by itself. The time required for separation can be shortened by raising the temperature of the water. Table 1 shows the composition of the adhesive used in Example 1.

TABLE 1

| Composition of adhesive of Example 1 | | | Degree of polymerization |
|---|---|---|---|
| Polyethylene glycol (end group: epoxy) | Denacol EX-821* | n = 4 | 100 |
| Polypropylene glycol (end group: epoxy) | Denacol EX-931* | n = 11 | 50 |
| Polyethylene glycol | Molecular weight: 1000 | n = 22 | 45 |
| Gap adjuster | SP-250** | | 0.5 |
| Photopolymerization initiator | CPI = 100P*** | | 3 |

*Product of Nagase Chemtex Corporation
**Product of Sekisui Chemical Co. Ltd.
***Product of San-Apro Ltd.

The structure obtained in this stage can be used as a completed product. As described above, an electronic component for interconnection, which is integrally supported by a support plate having a predetermined rigidity, is formed and connected to a multilayer substrate carrying an LSI chip, and a resin is charged into a space between the support plate and the multilayer substrate. After the resin is cured, the support plate which becomes unnecessary to impart rigidity to the electric component is removed. The solder resist layer of the electronic component for interconnection functions a protection film of the completed product. The outer interconnects exposed from the openings of the solder resist layer may be used as external electrodes.

Figure 33:
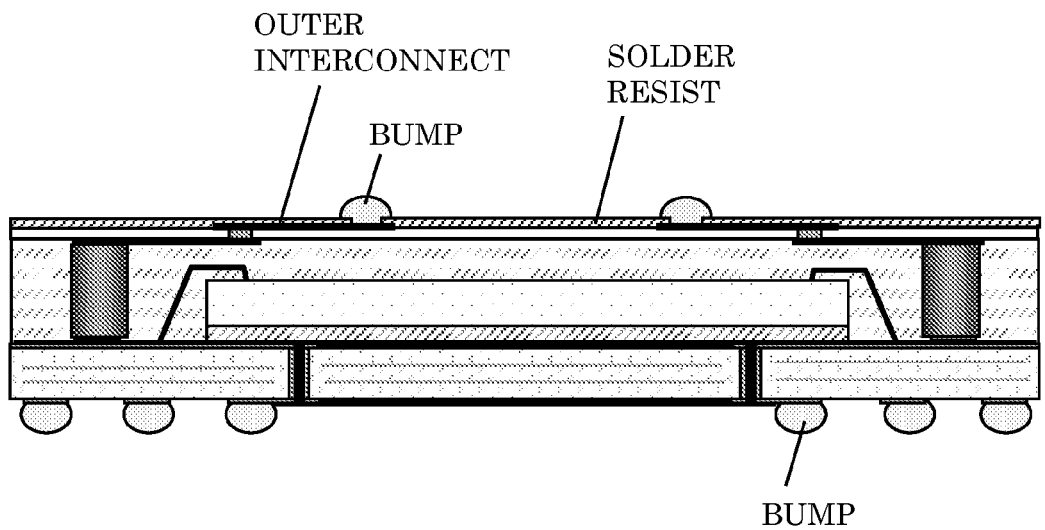
FIG. 33 is a view showing bump electrodes for external connection formed on the back face side and front face side of an organic substrate.

After that, as shown in FIG. 33, bump electrodes (external electrodes) may be formed on the end surface electrode portions (lands) formed on the back face side and front face side of the organic substrate. Furthermore, dicing is performed to obtain separated chips, which are completed products.

EXAMPLE 2

Figure 34A:
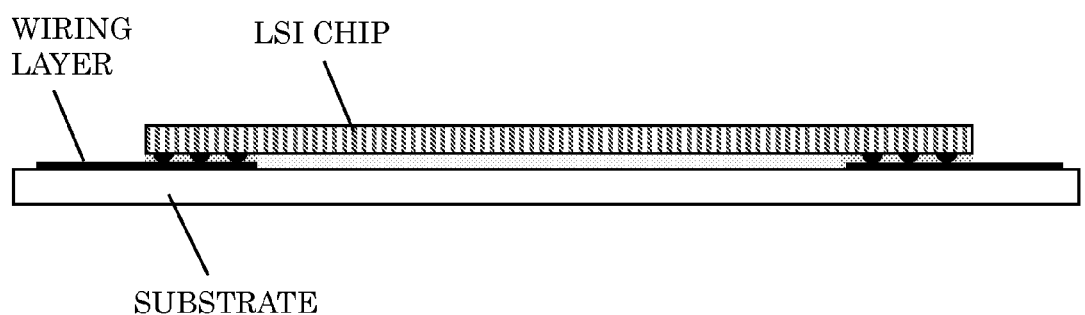
Figure 34B:
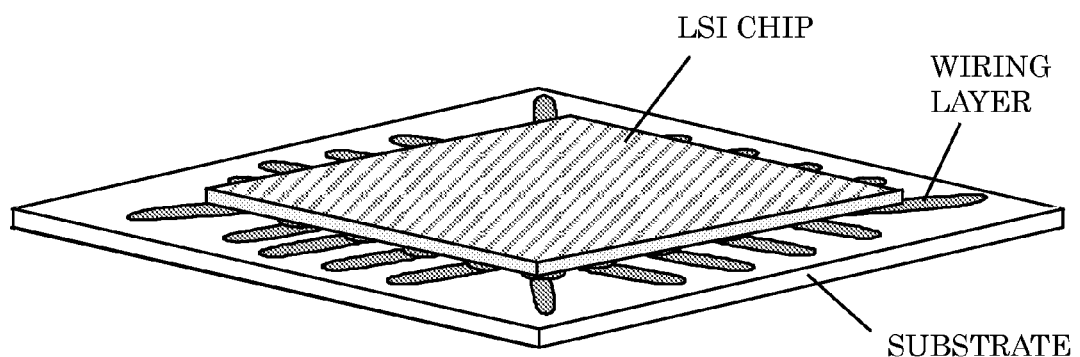

Next, manufacture of an electronic device package of a single-sided wiring substrate type including the electronic component for interconnection of the second example (see FIG. 11) will be described with reference to FIGS. 34A and 34B to FIG. 39. FIGS. 34(A) and 34(B) are views showing a state in which a semiconductor chip (an LSI chip) is bonded to a substrate and connected thereto as an electronic component, wherein FIG. 34(A) shows a sectional view, and FIG. 34(B) shows a perspective view. The illustrated substrate is a silicon substrate (semiconductor substrate) having a wiring layer (wiring pattern) on the upper surface thereof.

In order to form a wiring layer on the semiconductor substrate, a metal seed layer which will become the wiring pattern is formed on the entire surface of the semiconductor substrate (for example, a layer formed through sputtering or application of nano-metal). The seed layer may be formed of foil of gold, silver, copper, or palladium, which enables copper-plating. The pattern of the wiring layer is formed through a process in which resist is applied to the seed layer, patterning is performed through exposure and development, etching is performed, and the resist is removed. The wiring layer is grown on this seed layer through plating. Alternatively, the wiring layer may be formed by means of directly patterning the seed layer by use of nano-metal particles. In this case, the lithography step can be omitted. This direct patterning is a process of jetting in a desired pattern an organic solvent containing nano particles of metal such as copper by an ink jet method which is practically used in the field of printers.

In this example, the LSI chip is flip-chip bonded to the wiring layer on the substrate. In place of this flip-chip bond connection, bonding wire connection may be employed. Specifically, metal pad portions for bonding, which serve as bonding wire connection electrodes, are formed on the wiring layer on the substrate, and the LSI chip is connected to the metal pad portions via bonding wires. In this case, the metal pad portions on the wiring layer and the semiconductor LSI chip are connected through use of, for example, Au boding wire.

Figure 35:
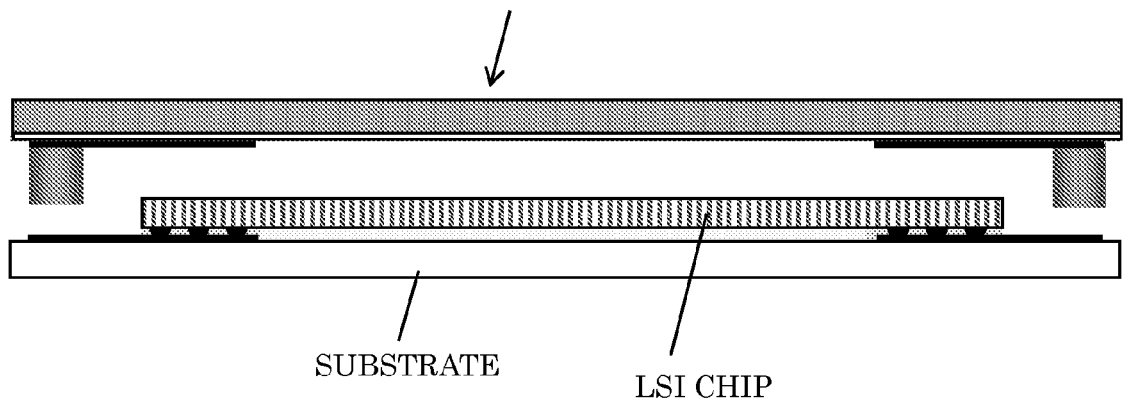
FIG. 35 is a view showing a state in which the second example of the electronic component for interconnection is disposed on a substrate carrying a semiconductor LSI chip.

FIG. 35 shows a state in which the second example of the electronic component for interconnection (see FIG. 11) is disposed on the substrate carrying a semiconductor LSI chip thereon (see FIG. 34). Notably, in this example, the second example of the electronic component for interconnection is used. However, the first example (see FIGS. 1(A) and 1(B)) or the third example (see FIG. 28) of the electronic component for interconnection may be used similarly.

Figure 36:
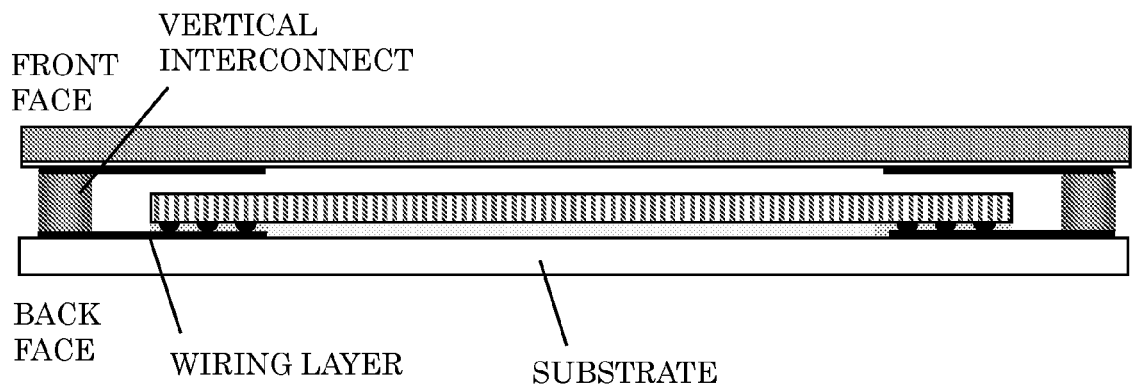
FIG. 36 is a view showing a state in which the electronic component for interconnection is connected to the substrate carrying a semiconductor LSI chip.

FIG. 36 shows a state in which the electronic component for interconnection is connected to the semiconductor substrate carrying a semiconductor LSI chip thereon. Notably, as shown in the drawing, the substrate side will be referred to the "back face," and the side where the electronic component for interconnection provided on the substrate is located will be referred to the "front face." The vertical interconnects of the electronic component for interconnection are fixed and electrically connected to predetermined regions of the wiring layer formed on the upper surface of the substrate. Example methods of fixing and connecting the vertical interconnects include (1) joining by ultrasonic waves, (2) connection by electrically conductive paste such as silver paste, (3) solder connection, (4) a method of providing recesses on metal pad portions for connection electrodes provided on a semiconductor substrate, providing projections on the electronic component for interconnection, and press-fitting the projections into the recesses or inserting the projections into the recesses followed by crimping.

Figure 37:
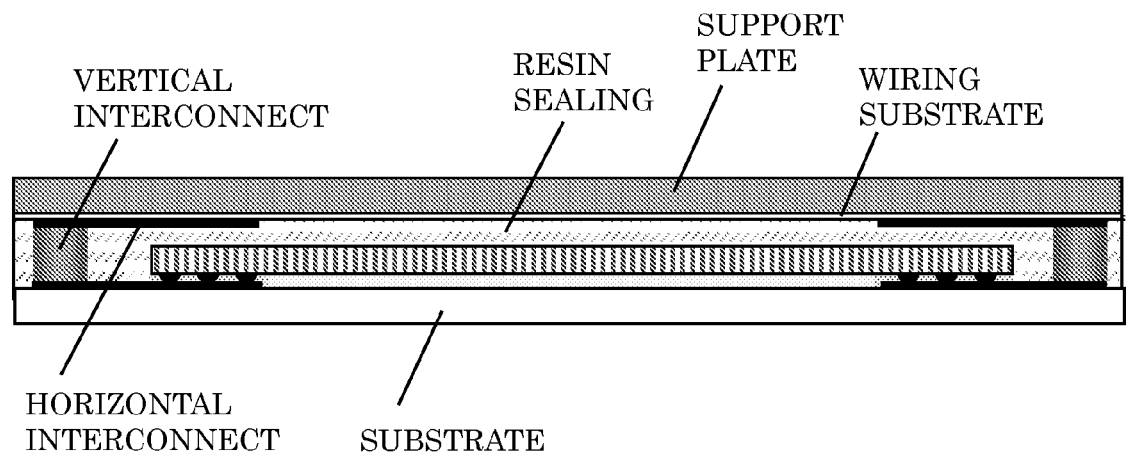
FIG. 37 is a view showing a state after performance of resin sealing.

FIG. 37 is a view showing a state after performance of resin sealing. After the vertical interconnects connected together are fixed, in this state, the upper surface of the substrate is transfer-molded, or resin-sealed by use of a liquid resin (e.g., epoxy resin), up to the lower surface of the support plate.

Figure 38:
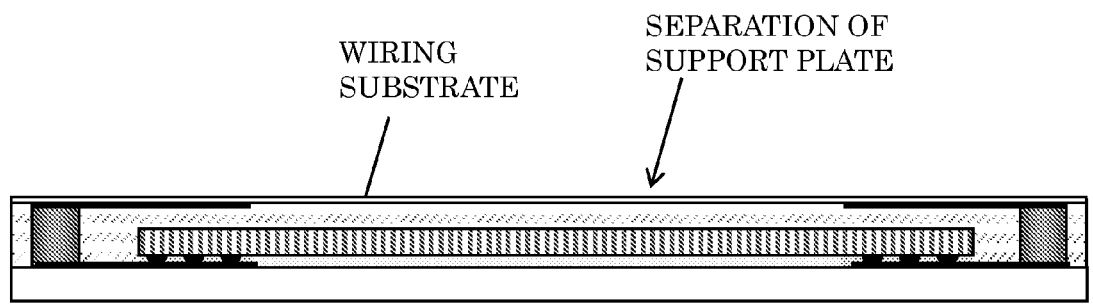
FIG. 38 is a view showing a state after the support plate is separated.

FIG. 38 is a view showing a state after separation of the support plate. As described above in relation to Example 1, the support plate is separated by immersing the entire structure shown in FIG. 37 into water or hot water. Table 2 shows the composition of the adhesive used in Example 2. The wiring layer exposed on the upper side of FIG. 38 (or the thin tape shown in FIG. 28) functions a protection film of the completed product. When the first example of the electronic component for interconnection (see FIGS. 1(A) and 1(B)) is used, the solder resist layer serves as a protection film.

TABLE 2

| Composition of adhesive of Example 2 | | | Degree of polymerization |
|---|---|---|---|
| Polyethylene glycol (end group: epoxy) | Denacol EX-850* | n = 2 | 100 |
| Polypropylene glycol (end group: epoxy) | Denacol EX-941* | n = 2 | 50 |
| Polyethylene glycol | Molecular weight: 300 | n = 7 | 45 |
| Gap adjuster | SP-250** | | 0.5 |
| Initiator | CPI= | 100P*** | 5 |

*Product of Nagase Chemtex Corporation
**Product of Sekisui Chemical Co. Ltd.
***Product of San-Apro Ltd.

FIG. 39 is a sectional view of the completed electronic device package. As shown in FIG. 39, on the font face side, holes (openings) are formed in the protection film (wiring substrate), and electrodes for external connection (bump electrodes) are formed such that the bump electrodes are connected to portions of the horizontal interconnects exposed from the openings. The horizontal interconnects enable the electrodes for external connection to be provided at positions different from those of the distal ends of the vertical interconnects.

The invention claimed is:

1. An electronic component for interconnection which is incorporated, for use, into an electronic device package in which a circuit element including a semiconductor chip is disposed and which has external electrodes connected to the circuit element via vertical interconnects and horizontal interconnects, the electronic component for interconnection comprising:
a wiring substrate;
the horizontal interconnects formed on at least one face of the wiring substrate, and the vertical interconnects connected to the horizontal interconnects and extending therefrom in a vertical direction; and
a support plate which is bonded to a side, opposite to the vertical connects, of the wiring substrate having the horizontal interconnects and the vertical interconnects through use of an adhesive which absorbs moisture and swells when immersed in water.

2. An electronic component for interconnection according to claim 1, wherein the adhesive contains an epoxy resin having an ethylene glycol moiety and having an epoxy group at each end, an epoxy resin having a propylene glycol moiety and having an epoxy group at each end, and a cationic polymerization initiator.

3. An electronic component for interconnection according to claim 2, wherein, when the epoxy resin having an ethylene glycol moiety and having an epoxy group at each end is referred to as ingredient A, the epoxy resin having a propylene glycol moiety and having an epoxy group at each end is referred to as ingredient B, and the cationic polymerization initiator is referred to as ingredient C, the adhesive contains the ingredient A in an amount of 100 parts by weight, the ingredient B in an amount of 10 to 70 parts by weight, and the ingredient C in an amount of 0.1 to 10 parts by weight with respect to the sum of the amounts of the ingredients A and B.

4. An electronic component for interconnection according to claim 2, wherein each of the horizontal interconnects is constituted by an inner interconnect which is directly connected to a vertical interconnect on one face of the wiring substrate, an outer interconnect formed on the opposite face of the wiring substrate, and a via interconnect which penetrates the wiring substrate and connects the inner interconnect and the outer interconnect together.

5. An electronic component for interconnection according to claim 2, wherein solder resist is applied to the outer side of the wiring substrate having the outer interconnect, and the support plate is bonded to the wiring substrate via the solder resist.

6. An electronic component for interconnection according to claim 2, wherein the adhesive contains spherical spacers such that the adhesive has a fixed thickness in a required region.

7. An electronic component for interconnection according to claim 1, wherein the support plate is formed of an electrically conductive or insulative material which can impart rigidity to the wiring substrate so as to maintain flatness, and the wiring substrate is formed of polyimide or glass epoxy.

8. An electronic component for interconnection according to claim 1, wherein the adhesive is applied to a side surface of the support plate and front and back surfaces of the support plate.

9. A method of manufacturing an electronic component for interconnection which is incorporated, for use, into an electronic device package in which a circuit element including a semiconductor chip is disposed and which has external electrodes connected to the circuit element via vertical interconnects and horizontal interconnects, the method comprising:
providing a wiring substrate;
forming via interconnects in the wiring substrate such that the via interconnects penetrate the wiring substrate, and forming inner interconnects and outer interconnects, which are to be connected to the via interconnects, on the inner and outer sides, respectively, of the wiring substrate, the inner interconnects, the via interconnects, and the outer interconnects constituting the horizontal interconnects;
forming the vertical interconnects which are connected to the inner interconnects and extend therefrom in a vertical direction;
applying solder resist to the side of the wiring substrate where the outermost interconnects are formed, excluding regions where openings for external connections are to be formed; and
bonding the wiring substrate applied with the solder resist to a support plate through use of an adhesive which absorbs moisture and swells when immersed in water.

10. A method of manufacturing an electronic component for interconnection according to claim 9, wherein the bonding of the wiring substrate to the support plate is performed by steps of dropping or applying a required amount of a liquid adhesive onto the support plate, irradiating the adhesive with ultraviolet rays, pressing and bonding the wiring substrate to the support plate, and heating the adhesive, or steps of dropping or applying a required amount of a liquid adhesive onto the support plate, pressing and bonding the wiring substrate to the support plate, and irradiating the adhesive with ultraviolet rays, and heating the adhesive, wherein the liquid adhesive contains an epoxy resin having an ethylene glycol moiety and having an epoxy group at each end, an epoxy resin having a propylene glycol moiety and having an epoxy group at each end, and a cationic polymerization initiator.

11. A method of manufacturing an electronic component for interconnection according to claim 9, wherein the vertical interconnects are formed by steps of applying resist onto the side of the wiring substrate where the inner interconnects are formed, performing exposure and development so as to form openings for the vertical interconnects, and performing plating while using the inner interconnects as current paths for the plating, to thereby fill the interiors of the openings with a plating metal.

12. A method of manufacturing an electronic component for interconnection according to claim 9, wherein the electronic component for interconnection is incorporated into an electronic device package which includes a substrate having a wiring layer, an LSI chip connection region connected to the wiring layer, and a vertical interconnect connection region provided on an upper surface of the substrate, and an LSI disposed on the upper surface of the substrate and wired to the LSI chip connection region, wherein, after the vertical interconnects are fixed and electrically connected to the vertical interconnect connection region on the substrate and resin sealing is performed, a resultant assembly is immersed into water or hot water so as to swell the adhesive, to thereby separate the support plate.

13. A method of manufacturing an electronic component for interconnection which is incorporated, for use, into an electronic device package in which a circuit element including a semiconductor chip is disposed and which has external electrodes connected to the circuit element via vertical interconnects and horizontal interconnects, the method comprising:
providing a wiring substrate;
forming the horizontal interconnects on the wiring substrate;
forming the vertical interconnects which are connected to the horizontal interconnects and extend therefrom in a vertical direction; and
bonding the wiring substrate having the horizontal interconnects and the vertical interconnects to a support plate through use of an adhesive which absorbs moisture and swells when immersed in water.

14. A method of manufacturing an electronic component for interconnection according to claim 13, wherein the step of forming the horizontal interconnects includes:
forming a lower metal layer on the wiring substrate;
forming an upper metal layer on the lower metal layer through use of a material different from that of the lower metal layer, and processing the upper metal layer into a horizontal connection pattern; and
etching the lower metal layer, after formation of he vertical interconnects, while using the upper metal layer as an etching mask, so that the lower and upper metal layers having the same pattern constitute the horizontal interconnects.

15. A method of manufacturing an electronic component for interconnection according to claim 13, wherein the bonding of the wiring substrate to the support plate is performed by steps of dropping or applying a required amount of a liquid adhesive onto the support plate, irradiating the adhesive with ultraviolet rays, pressing and bonding the wiring substrate to the support plate, and heating the adhesive, or steps of dropping or applying a required amount of a liquid adhesive onto the support plate, pressing and bonding the wiring substrate to the support plate, and irradiating the adhesive with ultraviolet rays, and heating the adhesive, wherein the liquid adhesive contains an epoxy resin having an ethylene glycol moiety and having an epoxy group at each end, an epoxy resin having a propylene glycol moiety and having an epoxy group at each end, and a cationic polymerization initiator.

16. A method of manufacturing an electronic component for interconnection according to claim 13, wherein the electronic component for interconnection is incorporated into an electronic device package which includes a substrate having a wiring layer, an LSI chip connection region connected to the wiring layer, and a vertical interconnect connection region provided on an upper surface of the substrate, and an LSI disposed on the upper surface of the substrate and wired to the LSI chip connection region, wherein, after the vertical interconnects are fixed and electrically connected to the vertical interconnect connection region on the substrate and resin sealing is performed, a resultant assembly is immersed into water or hot water so as to swell the adhesive, to thereby separate the support plate.

17. A method of manufacturing an electronic component for interconnection which is incorporated, for use, into an electronic device package in which a circuit element including a semiconductor chip is disposed and which has external electrodes connected to the circuit element via vertical interconnects and horizontal interconnects, the method comprising:
providing a wiring substrate;
forming a metal laminate composed of at least three layers including a lower metal layer for horizontal interconnects, an upper metal layer for horizontal interconnects, and a metal layer for vertical interconnects;
processing the lower metal layer for horizontal interconnects into a predetermined pattern, bonding the metal laminate including the patterned lower metal layer for horizontal interconnects to the wiring substrate, and processing the metal layer for vertical interconnects into a predetermined pattern, to thereby form the vertical interconnects;
processing the upper metal layer for horizontal interconnects into a predetermined pattern while using the vertical interconnects as a mask, so that the processed lower metal layer for horizontal interconnects and the processed upper metal layer for horizontal interconnects form the horizontal interconnects; and
bonding the wiring substrate having the vertical interconnects and the horizontal interconnects to a substrate through use of an adhesive which absorbs moisture and swells when immersed in water.

18. A method of manufacturing an electronic component for interconnection according to claim 17, wherein the bonding of the wiring substrate to the support plate is performed by steps of dropping or applying a required amount of a liquid adhesive onto the support plate, irradiating the adhesive with ultraviolet rays, pressing and bonding the wiring substrate to the support plate, and heating the adhesive, or steps of dropping or applying a required amount of a liquid adhesive onto the support plate, pressing and bonding the wiring substrate to the support plate, and irradiating the adhesive with ultraviolet rays, and heating the adhesive, wherein the liquid adhesive contains an epoxy resin having an ethylene glycol moiety and having an epoxy group at each end, an epoxy resin having a propylene glycol moiety and having an epoxy group at each end, and a cationic polymerization initiator.

19. A method of manufacturing an electronic component for interconnection according to claim 17, wherein the electronic component for interconnection is incorporated into an electronic device package which includes a substrate having a wiring layer, an LSI chip connection region connected to the wiring layer, and a vertical interconnect connection region provided on an upper surface of the substrate, and an LSI disposed on the upper surface of the substrate and wired to the LSI chip connection region, wherein, after the vertical interconnects are fixed and electrically connected to the vertical interconnect connection region on the substrate and resin sealing is performed, a resultant assembly is immersed into water or hot water so as to swell the adhesive, to thereby separate the support plate.

* * * * *